(12) United States Patent
Hirano et al.

(10) Patent No.: US 8,057,882 B2
(45) Date of Patent: Nov. 15, 2011

(54) MEMBRANE STRUCTURE ELEMENT AND METHOD FOR MANUFACTURING SAME

(75) Inventors: Takayuki Hirano, Kobe (JP); Nobuyuki Kawakami, Kobe (JP); Masato Kannaka, Kobe (JP)

(73) Assignee: Kobe Steel, Ltd., Hyogo (JP)

( * ) Notice: Subject to any disclaimer, the term of this patent is extended or adjusted under 35 U.S.C. 154(b) by 374 days.

(21) Appl. No.: 12/225,670

(22) PCT Filed: Mar. 28, 2007

(86) PCT No.: PCT/JP2007/056723
§ 371 (c)(1),
(2), (4) Date: Sep. 26, 2008

(87) PCT Pub. No.: WO2007/114191
PCT Pub. Date: Oct. 11, 2007

(65) Prior Publication Data
US 2009/0176064 A1    Jul. 9, 2009

(30) Foreign Application Priority Data

Mar. 28, 2006   (JP) ................................ 2006-087090

(51) Int. Cl.
*B32B 3/00* (2006.01)
*G01P 15/08* (2006.01)
*G01L 9/08* (2006.01)
*G01F 1/692* (2006.01)

(52) U.S. Cl. ........ 428/172; 428/157; 428/702; 257/417; 73/504.14

(58) Field of Classification Search .................... 428/13, 428/157, 172, 446, 701, 702; 430/5; 257/417; 73/504.14, 721
See application file for complete search history.

(56) References Cited

U.S. PATENT DOCUMENTS 6,265,113 B1    7/2001    Yabe et al.
(Continued)

FOREIGN PATENT DOCUMENTS

JP    04-286122    10/1992
(Continued)

OTHER PUBLICATIONS

Sheng, Lie-yi, et al., "A Low-Power CMOS Compatible Integrated Gas Sensor Using Maskless Tin Oxide Sputtering", 1997 International Conference on Solid-State Sensors and Actuators, Chicago, Jun. 16-19, 1997, pp. 939-942.

(Continued)

*Primary Examiner* — Donald J Loney
(74) *Attorney, Agent, or Firm* — Stites & Harbison PLLC; Juan Carlos A. Marquez, Esq.

(57) ABSTRACT

It is intended to provide a membrane structure element that can be easily manufactured, has an excellent insulating property and high quality; and a method for manufacturing the membrane structure element. The manufacturing method is for manufacturing a membrane structure element including a membrane formed of a silicon oxide film and a substrate which supports the membrane in a hollow state by supporting a part of a periphery of the membrane. The method includes: a film formation step of forming a heat-shrinkable silicon oxide film 13 on a surface of a silicon substrate 2 by plasma CVD method; a heat treatment step of performing a heat treatment to cause the thermal shrinkage of the silicon oxide film 13 formed on the substrate 1; and a removal step of removing a part of the substrate 2 in such a manner that a membrane-corresponding part of the silicon oxide film 13 is supported as a membrane in a hollow state with respect to the substrate 2 to form a recessed part 4.

2 Claims, 5 Drawing Sheets

U.S. PATENT DOCUMENTS

2005/0170265 A1* 8/2005 Moriya .............................. 430/5
2005/0274191 A1* 12/2005 Hasegawa et al. .............. 73/721

FOREIGN PATENT DOCUMENTS

| | | |
|---|---|---|
| JP | 6-132277 | 10/1992 |
| JP | 7-135157 | 9/1993 |
| JP | 8-264844 | 3/1995 |
| JP | 9-306812 | 5/1996 |
| JP | 11-274067 | 4/1998 |
| JP | 2004-353070 | 5/2003 |
| JP | 2005-308698 | 11/2005 |

OTHER PUBLICATIONS

International Search Report for PCT/JP2007/056723 mailed Jun. 12, 2007.

Notification of Reasons for Rejection dispatched Feb. 23, 2011 by the Japanese Patent Office in the corresponding Japanese Application No. 2007-057956 (2 pages) with an English language translation (2 pages).

* cited by examiner

MEMBRANE STRUCTURE ELEMENT AND METHOD FOR MANUFACTURING SAME

TECHNICAL FIELD

This invention relates to a membrane structure element to be mainly used for an infrared sensor, an air flow meter, and a thermal sensor such as a gas sensor.

BACKGROUND ART

In recent years, various techniques for producing a thermal sensor by using semiconductor microfabrication have been developed. A hollow structure in which a membrane provided with a detection electronic element is supported in a hollow state with respect to a substrate is in some cases adapted to a thermo sensor for the purpose of ensuring heat insulating property with respect to the substrate. An element having the structure where the membrane is supported in a hollow state is called a membrane structure element.

In general, a membrane is formed of a silicon oxide film such as a $SiO_2$ (silicon dioxide) film that is excellent in heat insulating property, and such a film is easily formed by oxidizing a surface of a silicon substrate. The $SiO_2$ film formed by the surface oxidation is called "heat oxidized $SiO_2$ film". However, since the heat oxidized $SiO_2$ film has a heat expansion coefficient that is smaller than almost all of substrate materials such as a single crystal silicon, in the case where the hollow structure is formed by forming a heat oxidized $SiO_2$ film to be used as a membrane, followed by cooling and then removing the substrate material below the heat oxidized $SiO_2$ film by etching or the like to form a recessed part, the membrane supported in the hollow state may be brought into "sagged" state due to a large compression stress (about 200 MPa when the substrate is a single crystal silicon) remaining in the heat oxidized $SiO_2$ film. Therefore, quality of the membrane structure element is deteriorated and strength of the membrane is deteriorated to entail a membrane breakage in the case of grave deterioration. Therefore, formation itself of a membrane having a large area becomes difficult.

Accordingly, various techniques for producing a membrane having a large area while minimizing an internal stress remaining in the membrane after membrane formation have been proposed. For example, JP-A-6-132277 (Patent Reference 1) discloses a technique for alleviating a remaining stress of a membrane as a whole by forming the membrane by laminating the $SiO_2$ film and $Si_3N_4$ film having different thermal expansion coefficients to reduce an internal compressed remaining stress of a $SiO_2$ film with the use of a $Si_3N_4$ film. Further, JP-A-8-264844 (Patent Reference 2) discloses a technique for reducing Young's modulus of a membrane by forming a central part of the membrane with the use of a $Si_3N_4$ film and adding a group V element to a $SiO_2$ film. Also, Lie-yi Sheng et al., Transducers '97, 1997, pp. 939-942 (Non-Patent Reference 1) proposes a method of eliminating sagging of a membrane by using a polysilicon wiring serving also as a heater for a $SiO_2$ film as "bones in a kite".

Patent Reference 1: JP-A-6-132277
Patent Reference 2: JP-A-8-264844
Non-Patent Reference 1: Lie-yi Sheng et al., Transducers '97, 1997, pp. 939-942

DISCLOSURE OF THE INVENTION

Problem That the Invention Is To Solve

However, in accordance with the method disclosed in Patent Publication 1, it is necessary to form the $Si_3N_4$ film having totally different composition from the $SiO_2$ film. What is more, since the heat conductivity of $Si_3N_4$ is 22.7 W/mK which is larger than the heat conductivity (1.4 W/mK) of $SiO_2$ by more than an order, a heat insulating property of the membrane is reduced. Additionally, when the area is intended to increase, warping of the membrane as a whole occurs as in bimetal due to the difference in heat expansion coefficients, thereby deteriorating reliability. In the method disclosed in Patent Reference 2, the production process is complicated to impair freedom of element designing. Since a reduction in stress of the membrane as it is is not considered in the method disclosed in Non-Patent Reference 1, warping still occurs to impair freedom of designing.

Means For Solving the Problem

The inventors found that, in the case of forming an silicon oxide film constituting a membrane by plasma CVD method, although a compression stress remains in the film as in the heat oxidized silicon oxide film, when a heat treatment is subsequently performed, it is possible to suppress the stress to ±100 MPa or less around a room temperature since the film is densified to be heat-shrunk. By reducing the remaining stress of the film as described above, little or no warping occurs in the silicon oxide film even when the membrane is supported in a hollow state, and it is possible to obtain a membrane excellent in heat insulating property due to silicon oxide and in flatness. This invention was accomplished based on the above findings.

That is, a membrane structure element manufacturing method of this invention is a method for manufacturing a membrane structure element including a membrane formed of a silicon oxide film and a substrate which supports the membrane in a hollow state by supporting a part of a periphery of the membrane, the method including: a film formation step of forming a heat-shrinkable silicon oxide film on a surface of a substrate formed of a material having a heat expansion coefficient that is higher than a heat expansion coefficient of silicon oxide; a heat treatment step of heating the heat-shrinkable silicon oxide film to cause a heat shrinkage of the film; and a removal step of removing a part of the substrate in the form of a recess so that a corresponding part of the silicon oxide film corresponding to the membrane is supported as the membrane in a hollow state with respect to the substrate.

According to the manufacturing method of this invention, since the heat-shrinkable silicon oxide film is formed on the substrate and the silicon oxide film thus formed is heat-shrunk in a heat treatment step, it is possible to easily alleviate or resolve an internal compression stress of the silicon oxide film after the formation of the silicon oxide film on the substrate. Therefore, it is possible to prevent deflection and warping of the membrane even when the membrane is supported in a hollow state by the substrate owing to the removal step, thereby making it possible to obtain a high-quality membrane that is readily supported in a flat shape. Furthermore, since the membrane is formed only of the silicon oxide film, it is excellent in heat insulating property and easily produced as compared to a composite film with $Si_3N_4$, and it is possible to improve strength and durability of the membrane itself by densifying the membrane.

Furthermore, in the manufacturing method described above, it is possible to provide an element formation step of forming a metal wiring having a predetermined pattern on a surface of the silicon oxide film, and it is also possible to easily form the heat-shrinkable silicon oxide film by plasma CVD method. In the case of the film formation by plasma CVD method, it is preferable to use a silane gas as a film-formation raw material gas; and to set a substrate temperature at 200° C. or less and set an input electric power to 0.21 W/cm² or less during the film formation.

Moreover, in the heat treatment step described above, the heating temperature may preferably be set at 400° C. or more. Furthermore, in order to achieve uniform shrinkage of the heat-shrinkable silicon oxide film, the silicon oxide film is preferably heated together with the substrate, and the heating is preferably performed so that the internal stress of the silicon oxide film becomes within a stretching stress range of stretching of (+) 100 MPa to compression of (−) 100 MPa, more preferably within a range of +50 MPa to 0 MPa. According to such a constitution, it is possible to obtain a membrane which is excellent in flatness and has a hollow structure. In addition, it is possible to easily form a recessed part below the membrane along the substrate surface by using the substrate formed of a single crystal silicon and removing a part of the substrate by silicon anisotropic etching in the removal step.

The membrane structure element of this invention includes a membrane formed of a silicon oxide film and a substrate which supports the membrane in a hollow state by supporting a part of a periphery of the membrane, in which the silicon oxide film is supported by the substrate in a flat shape due to a heat shrinkage. As to flatness of the membrane, a maximum deflection amount of the membrane may preferably be 0.1% or less of a maximum width of the membrane when a surface of the silicon oxide film which is formed on the substrate surface and has the same constitution as the membrane is taken as a reference surface. According to this membrane structure element, since the membrane is formed of the silicon oxide film and supported in the flat shape due to the heat shrinkage, the manufacture thereof is easy, and the membrane is excellent in heat insulating property and quality as well as in reliability and durability as an electronic component part.

Advantage of the Invention

According to the membrane structure element manufacturing method of this invention, since the film as a base of the membrane is previously formed of the heat-shrinkable silicon oxide film, followed by heating the silicon oxide film to cause the heat shrinkage thereof in the heat treatment step, it is possible to easily control the internal stress of the silicon oxide film over the range of from compression to stretching as well as to easily establish a membrane hollow structure excellent in flatness and quality while resolving the internal stress of the membrane without employing a complicated film structure having different compositions and a complicated manufacturing step. Further, according to the membrane structure element of this invention, since the membrane is formed of the silicon oxide film and supported in a flat shape due to the heat shrinkage, the manufacture thereof is easy, and the membrane structure element is excellent in quality as well as in reliability and durability as an electronic component part. Consequently, according to this invention, in a membrane structure element to be used for a thermal sensor such as an infrared sensor, an air flow meter, a gas sensor, it is possible to provide an element simplified in element structure and production step and having enhanced performance and improved reliability.

BRIEF DESCRIPTION OF THE DRAWINGS

FIGS. 1(1) through 1(4) are diagrams showing a manufacturing process of a membrane structure element according to one embodiment of this invention.

FIG. 2(1) is a diagram showing a sectional view and FIG. 2(2) is a diagram showing a plane view of the membrane structure element according to the embodiment of this invention. Shown in FIG. 2(1) is the sectional view taken along an A-A section of FIG. 2(2).

DESCRIPTION OF NUMERALS AND SIGNS

1: membrane
2: substrate
3: silicon oxide film
6: Pt/Ti wiring element (electronic element)
13: heat-shrinkable silicon oxide film

BEST MODE FOR CARRYING OUT THE INVENTION

Hereinafter, a membrane structure element according to one embodiment of this invention will be described together with a manufacturing method thereof. Shown in FIGS. 2(1) and 2(2) is the membrane structure element according to the embodiment, and the element is provided with a membrane 1 which is formed of a silicon oxide film 3 and has a square shape as viewed in plane view; and a silicon substrate 2 in which the silicon oxide film 3 having the same film constitution as that of the silicon oxide film constituting the membrane 1 is laminated on the surface thereof. The membrane 1 is supported on a recessed part 4 provided on the substrate 2 in a hollow state and a flat shape by four support arms 5. The membrane 1, the support arms 5, and the silicon oxide film 3 on the substrate are integrally formed so that the support arms 5 connect four corners of the membrane 1 and the substrate 2. A Pt/Ti wiring element 6 which constitutes a detection electronic element and has two layer structure lines of a Pt layer and a Ti layer disposed as being bent upward and downward is formed on a surface of the membrane 1 by laminating.

Hereinafter, the manufacturing method for the membrane structure element according to the above-described embodiment will be described with reference to FIGS. 1(1) through 1(4). A general purpose silicon substrate (single crystal silicon substrate having a crystal orientation of (100)) 2 is prepared, and considerably thin heat oxidized silicon oxide films 11 and 12 having a thickness of about 0.1 μm are formed by heat oxidation on front and back surfaces of the substrate 2 as shown in FIG. 1(1). The heat oxidized silicon oxide film 12 on the back surface is formed for the purpose of protection of the back surface of the silicon substrate when etching the silicon substrate in a subsequent step. The heat oxidized silicon oxide film 11 on the front surface is basically not necessary. Therefore, the heat oxidized silicon oxide film 11 on the front surface may be removed after the film formation, or it is possible to omit the formation of heat oxidized silicon oxide films on the front and back surfaces by providing an appropriate protection film on the back surface of the substrate. Since a compression stress of about 200 MPa remains in the heat oxidized silicon oxide film, it is preferable that the heat oxidized silicon oxide film 11 does not exist on the front surface. However, the heat oxidized silicon oxide film 11 is considerably thin (about 0.1 μm), and it is possible to ignore influences to be exerted on the remaining stress by sufficiently increasing a thickness of a heat-shrinkable silicon oxide film 13 as compared to the heat oxidized silicon oxide film 11. Therefore, the heat oxidized silicon oxide film 11 on the front surface is left as it is in this embodiment.

Next, as shown in FIG. 1(2), the heat-shrinkable silicon oxide film 13 is formed on the front surface of the heat oxidized silicon oxide film 11. This step is called a film formation step. A thickness of the heat-shrinkable silicon oxide film may be set within a range of from 0.1 to 10 μm from the view point of strength and heat insulating property of the film. In the case of forming the heat oxidized silicon oxide film 11, it is recommendable to set the thickness to five times or more that of the heat oxidized silicon oxide film. Note that the heat oxidized silicon oxide film 11 on the front surface and the heat-shrinkable silicon oxide film 13 are not particularly discriminated, and they are referred to as the silicon oxide film 3.

As a film formation method for the heat-shrinkable silicon oxide film 13, plasma CVD method is the optimum method in view of its film formation speed and easiness of film formation. Hereinafter, an input power for plasma in the case of forming the silicon oxide film by plasma CVD method and a stress remaining in the film will be described.

A silicon oxide film was formed by the following procedure. A silicon substrate (thickness: 525 μm) on which the heat oxidized silicon oxide film 11 (film thickness: 0.1 μm) had been formed was prepared, and a silicon oxide film having a film thickness of 1 μm was formed thereon by plasma CVD method. Each of a platform and an electrode opposed to the platform of a plasma CVD apparatus used for the film formation had a diameter of 30 cm (surface area: about 707 cm$^2$). Various silicon oxide films were formed under the film formation conditions in which a mixture gas of $SiH_4N_2$, $N_2O$ was used, a gas pressure was set to 80 Pa, a substrate temperature was set at 200° C. or 300° C., and input powers for plasma were varied.

After the film formation, film remaining stresses were measured using the respective silicon oxide films. The film remaining stress was detected based on a warping amount of the substrate and in accordance with the following formula. As the warping amount, a value measured at a room temperature (23° C.) was used. The warping amount of the substrate was measured using reflections of laser beams or a probe type surface roughness meter while supporting three points of the substrate (diameter: 100 mmφ).

$$\sigma = \frac{1}{6} \times \{1/R_{post} - 1/R_{pre}\} \times E/(1-v) \times ts^2/tf$$

In this formula, E is Young's modules of the substrate (silicon), v is a Poisson's ratio of the substrate (silicon), $R_{post}$ is a radius of curvature of warping of the substrate after film formation, $R_{pre}$ is a radius of curvature of warping of the substrate before film formation, ts is a thickness of the substrate, tf is a thickness of the film, and a value of E/(1-v) is $1.8 \times 10^{11}$ Pa in the case of the single crystal silicon (100) substrate.

Figure 3:
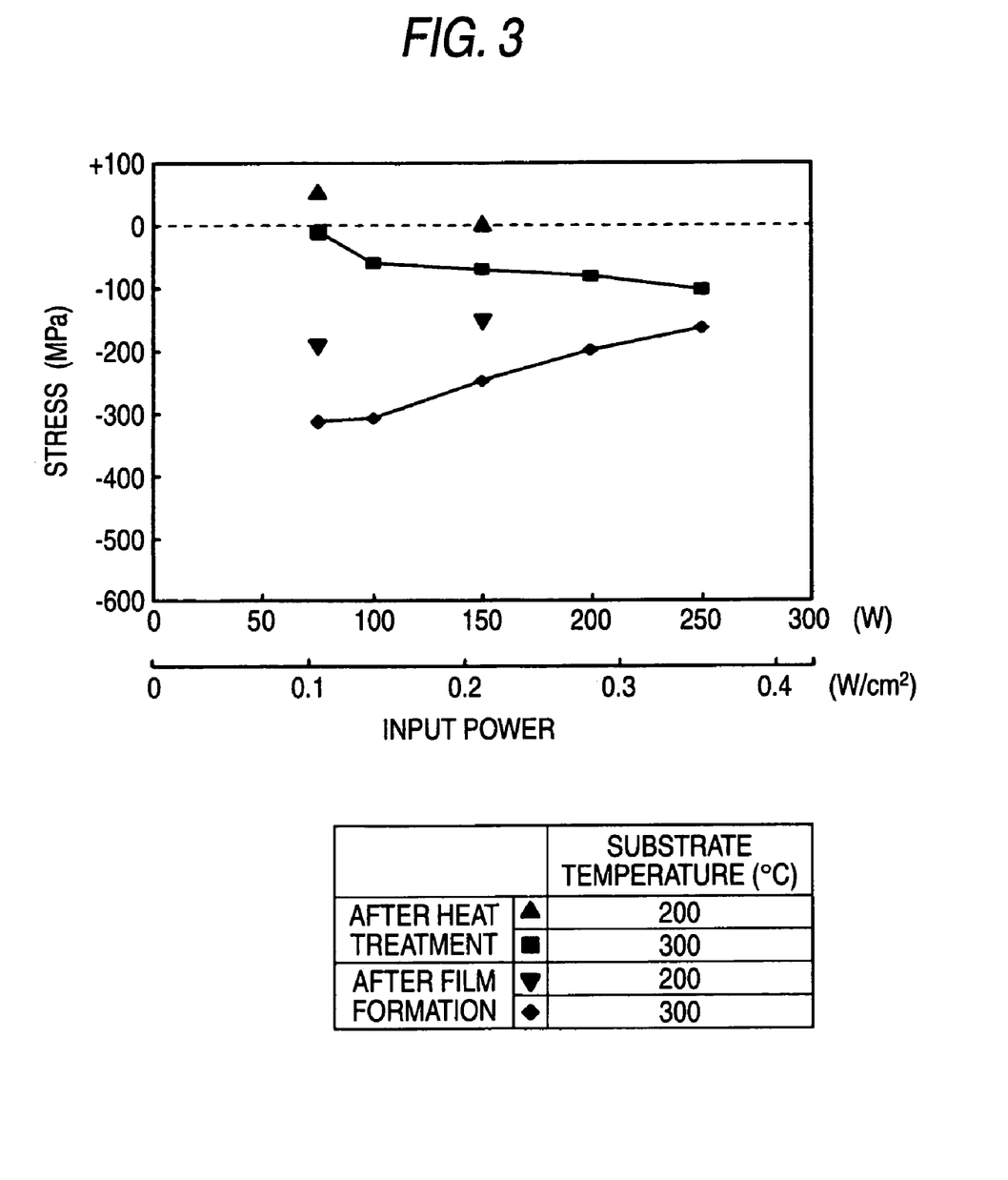
FIG. 3 is a graph showing a relationship between an input electrical power of plasma CVD and a stress of a silicon oxide film.

Shown in FIG. 3 is a relationship between the input power for plasma and the stress remaining in the film detected as described above. According to this figure, the remaining stress of the film is −300 MPa (compression) when the substrate temperature is 300° C. and the input power is 100 W, for example, and it is apparent that the internal stress after the film formation is reduced in absolute value along with an increase in input power. It is revealed that the remaining stress of the silicon oxide film after the film formation is a compression stress from the fact that the substrate after the film formation is warped with the silicon oxide film surface being projected. Also, it is revealed that the remaining stress is alleviated when the substrate temperature is 200° C. in comparison with the case that the substrate temperature is 300° C.

Subsequently, the substrate on which the heat-shrinkable silicon oxide film is formed is subjected to a heat treatment to cause the heat shrinkage of the heat-shrinkable silicon oxide film 13, thereby alleviate or resolve the internal compression remaining stress of the silicon oxide film 13. This step is called a heat treatment step.

Figure 4:
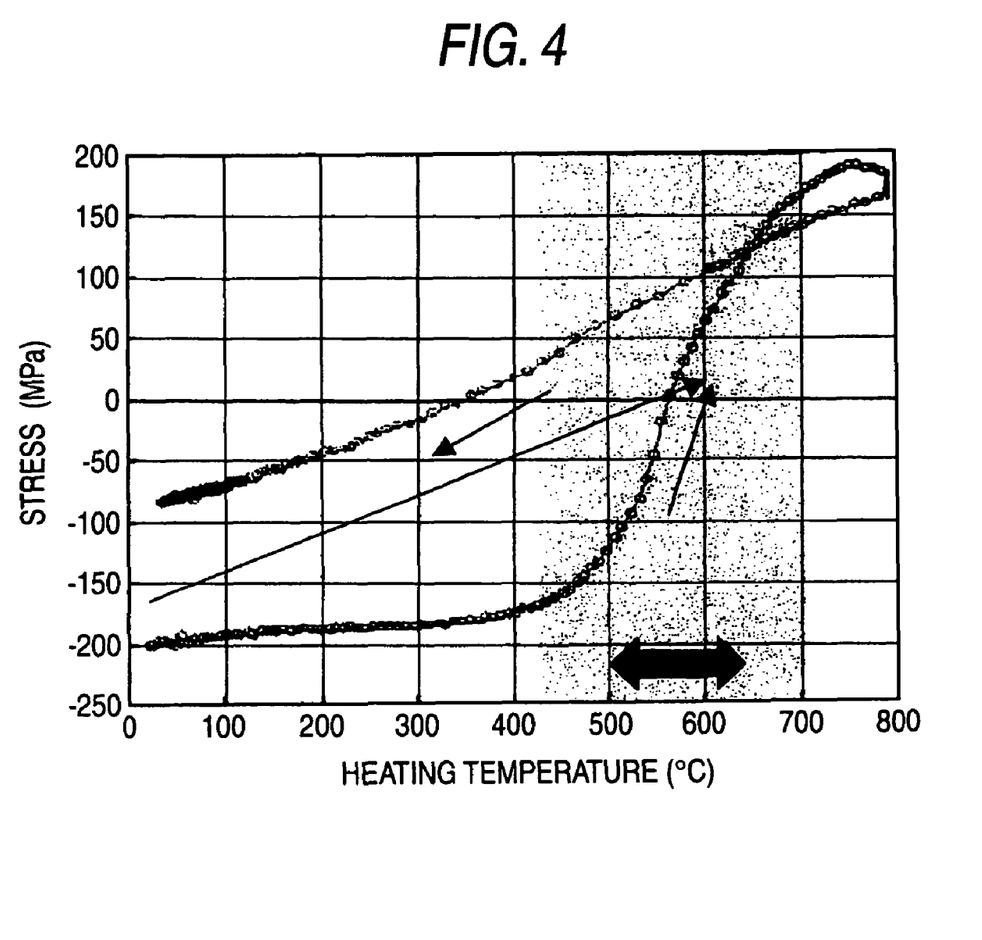
FIG. 4 is a graph showing a relationship between a heating temperature and a film stress of the silicon oxide film formed by plasma CVD.

Hereinafter, the action of the heat treatment for alleviating the compression remaining stress will be described in detail. By using a silicon substrate on which a silicon oxide film was formed at a substrate temperature of 300° C. and with an input power for plasma CVD of 200 W, an internal stress with respect to a heating temperature when heating the silicon substrate in a nitrogen gas atmosphere was measured. The results are shown in FIG. 4. Heating of the silicon oxide film was performed by inserting the silicon substrate on which the silicon oxide film was formed into a heating furnace in such a manner that a temperature of the silicon substrate and a in-furnace ambient temperature which was controlled to a measurement temperature were substantially the same and that a retention time at the measurement temperature was set to 1 hour. A measurement device used for the measurement was type-F2410 manufactured by KLA-Tencor.

According to FIG. 4, substantially no change was observed until around 400° C. with the stress that was −200 MPa before the heat processing, and then the stress sharply changed between 400° C. and 700° C. (changed to the positive value). It is considered that the internal stress changed to the positive value (stretching stress) since the film was densified to shrink a little due to a reaction of non-bonding hands in the silicon oxide film in the temperature region. The inclination of the curvature was reduced between 700° C. and 800° C., and the stress was reduced almost linearly when the temperature was lowered ultimately reaching to a value of about −80 MPa at a room temperature. From the results, it is revealed that the heating temperature in the heat treatment may preferably be 400° C. or more. It is also revealed that, although the heating may be performed at about 1000° C. more, the heating temperature may preferably be 800° C. or less, more preferably 700° C. or less.

A heat treatment in a nitrogen gas at 800° C. for 1 hour was performed on the substrates on each of which a silicon oxide film was formed by the above-described plasma CVD method with changing the input power. As to the stress after the heat treatment, it is revealed that the stress alleviating effect of the film formed with the reduced input power is greater as shown in FIG. 3. Further, the heat-shrinkable silicon oxide film formed at the substrate temperature of 300° C. achieved the internal stress of substantially 0 at the input power of 75 W, and the average internal stress was reduced to about −50 MPa. Moreover, the remaining stress of the heat-shrinkable silicon oxide film formed at the substrate temperature of 200° C. with the input power of 75 to 150 W (0.11 to 0.21 W/cm$^2$) is 0 to +50 MPa which means that the internal stress is a stretching stress.

Furthermore, according to FIG. 3, it is proved that the film remaining stress alleviating effect by the heat treatment is increased to make the stress adjustment easier when the input power is smaller and the substrate temperature is lower. In order to perform adjustment to the appropriate stress range depending on the material of the substrate and the thickness of the heat-shrinkable silicon oxide film, the adjustment of the input power and the substrate temperature is considered to be effective as described above. In the case of forming the film having the thickness of about 1 μm that is appropriate for the application of this invention on the single crystal substrate, as is apparent from FIG. 3, it is possible to adjust the film remaining stress to about −100 MPa or less by setting the substrate temperature to 300° C. or less and the input power to 250 W (0.35 W/cm$^2$) or less, and it is possible to adjust the film remaining stress to about −50 MPa or less by setting the substrate temperature to 300° C. or less and the input power to 150 W (0.21 W/cm$^2$) or less. Further, it is possible to adjust the film remaining stress to the stretching stress of about 0 to +50 MPa by setting the substrate temperature to 200° C. or less and the input power to 150 W (0.21 W/cm$^2$) or less. From the view point of ensuring stability of the film formation by plasma CVD method, it is preferable to set the input power to 50 W (0.07 W/cm$^2$) or more and the substrate temperature to 100° C. or more.

Figure 5:
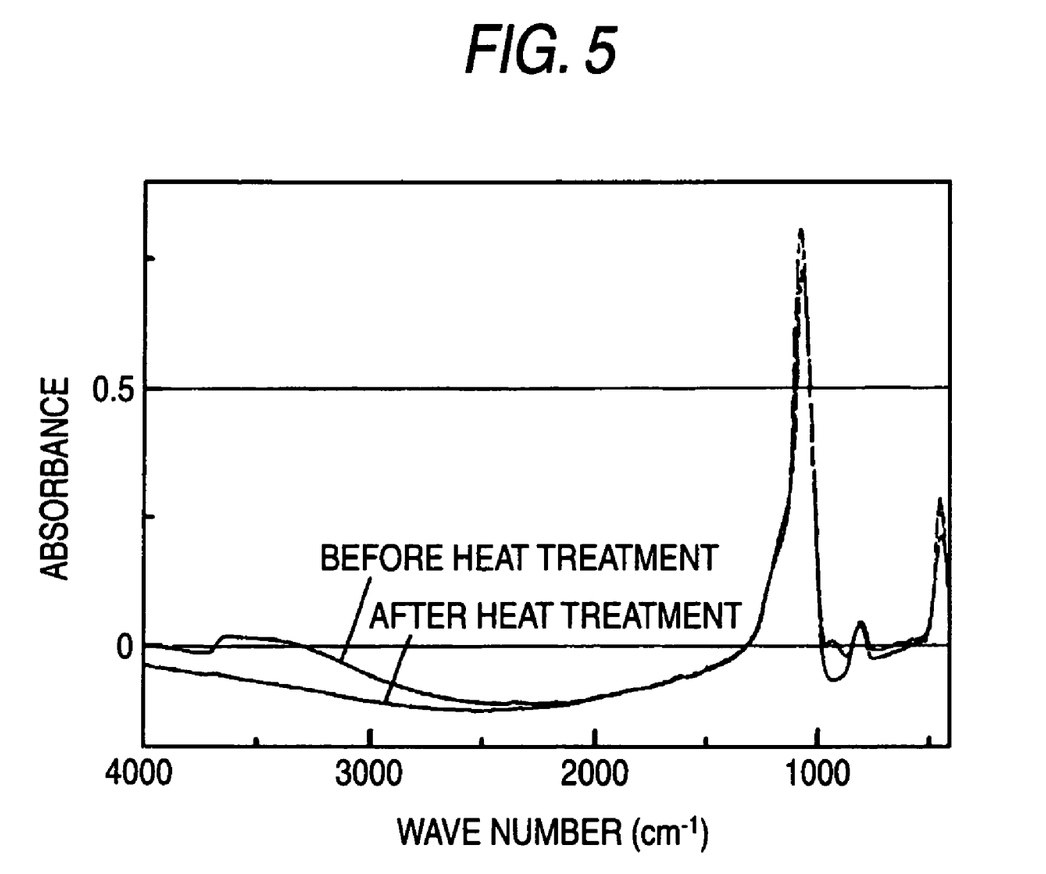
FIG. 5 is a diagram showing an infrared absorption spectrum of a silicon oxide film before heat treatment and after heat treatment.

Further, the stress alleviating effect by the heat treatment was confirmed from the view point of framework by the following investigation. A bonding state of silicon oxides of each of a heat-shrinkable silicon oxide film after film formation (before heat treatment) and the silicon oxide film after heat treatment was examined by Fourier transformation infrared spectroscopy (FTIR). As one example, shown in FIG. 5 is an infrared absorption spectrum of the film obtained at the substrate temperature of 200° C. and the input power of 75 W shown in FIG. 3. From FIG. 5, it is proved that absorption bands by Si—OH bonds and H$_2$O observed at a wave number of 300 to 3700 cm$^{-1}$ and near 950 cm$^{-1}$ disappear due to the heat treatment, and that a dominant band of silicon oxides near 1070 cm$^{-1}$ shows tendency of increase. That is, the silicon oxide film is changed from the state in which many imperfect bonds are present to the more dense silicon oxide film by the heat treatment. Accordingly, it is considered that the film is shrunk by the heat treatment to be changed into a stretching stress state.

Subsequently, as shown in FIG. 1(3), a Pt/Ti wiring element having a predetermined pattern is formed by a lift-off method or the like on the silicon oxide film 3 after the heat treatment. Although necessary wiring patterns are formed on the silicon oxide film 3 in addition to the detection element wiring pattern, such wiring patterns are omitted in the drawings. This step is called an element formation step.

Figure 1:
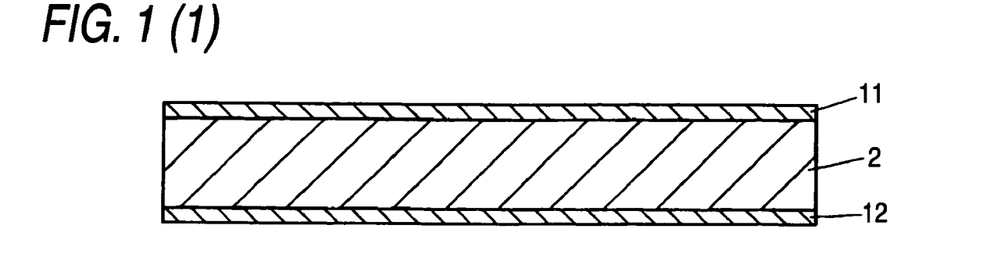
Figure 2:
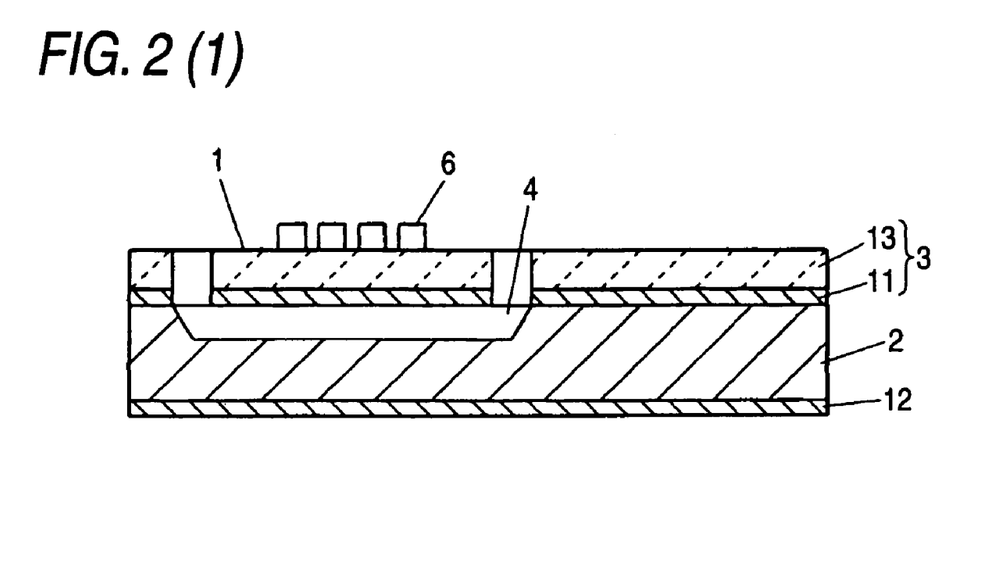

Subsequently, in order to make the vicinity of a silicon oxide film part (membrane-corresponding part) including the Pt/Ti wiring element in a hollow structure, silicon of the substrate 2 below the membrane-corresponding part is removed. This step is called a removal step. More specifically, as shown in FIG. 1(4), an opening 14 is formed around the membrane-corresponding part by removing the silicon oxide film 3 by the use of a chemical or physical means while avoiding parts corresponding to the support arms 5 of the membrane 1 (see FIGS. 2(1) and 2(2)). After that, the substrate 2 is impregnated into an etching liquid to perform etching on silicon of the substrate 2 exposed inside the opening 14. At this time, silicon is subjected to anisotropic etching that depends on the crystal orientation, so that the recessed part 4 penetrating in a horizontal direction below the membrane-corresponding part is easily formed. As the etching liquid, for example, a TMAH (tetramethylammonium hydroxide) solution heated to about 80° C. is used. After forming the recessed part 4, the etching liquid is washed off so as not to break the membrane, followed by drying, to thereby complete the membrane structure element shown in FIG. 2.

Among the thus-manufactured membrane structure elements, each of those formed at the substrate temperature of 300° C. and with the input power in the plasma CVD of 100 W or 200 W (each the stresses of the silicon oxide films 3 after the film formation was −300 MPa or −200 MPa) was subjected to a measurement of a maximum deflection amount (distance from the surface of the silicon oxide film 3 of the substrate as a reference surface to a surface of a maximum deflection part of the membrane) of the membrane supported in the hollow state at a room temperature, and a ratio of the maximum deflection amount to the maximum width of the membrane was detected. The maximum deflection amount of the membrane was measured by employing an optical method. More specifically, the measurement was conducted by employing a height measurement function of a microscope. As a result, the one formed with the input power of 100 W achieved the ratio of 0.05%, and the one formed with the input power of 200 W achieved the ratio of 0.1%, thereby ensuring that the membranes are supported by the substrate in a remarkably flat shape.

When a current is supplied to the Pt/Ti wiring element in the membrane structure element having the above-described hollow structure, the temperature is easily increased due to the heat insulating property and heat capacity of the membrane structure, and, in the case where the membrane structure element is used for an air flow sensor or the like, it is possible to detect from a change in resistance of the Pt/Ti detection element an air flow amount associated with a speed at which the heat is drawn from the hollow structure.

Although the heat-shrinkable silicon oxide film 13 is formed by plasma CVD method in the film formation method in the above embodiment, it is possible to employ any method that is capable of forming the silicon oxide film having a lower density than that of the heat oxidized silicon oxide film, such as PVD method including sputtering and vapor deposition, and a sol/gel method, without limitation to the plasma CVD method. Further, although the single crystal silicon substrate is used as the substrate in the above-described embodiment, it is possible to use other crystals, a ceramic, a resin, or the like without limitation to the single crystal silicon substrate.

Moreover, because of the easiness of the manufacture of the membrane excellent in hollowness and flatness, the film formation step, the heat treatment step, the element formation step, and the removal step are performed in this order in the above-described embodiment, it is possible to form a silicon oxide film on a wiring element after forming the wiring element on a silicon oxide film so as to enclose the wiring element with the silicon oxide films (the films are present below and above the element) insofar as the element formation step is performed in advance of the removal step. Further, the heat treatment step and the removing step may be exchanged in the case where the element forming step is not performed.

The invention claimed is:
1. A membrane structure element, comprising:
a membrane formed of a silicon oxide film,
a substrate having a portion of said substrate which supports a portion of a periphery of the membrane,
a hollow portion configured below said membrane and formed in said substrate,
wherein the silicon oxide film has a flattened shape with an internal stress ranging from (+)100 MPa to (−)100 MPa.
2. The membrane structure element according to claim 1, wherein a maximum deflection amount of the membrane is 0.1% or less of a maximum width of the membrane when a surface of the silicon oxide film which is formed on the surface of a portion of the substrate and has an identical constitution with the membrane taken as a reference surface.

* * * * *